(12) United States Patent
Roy et al.

(10) Patent No.: US 10,162,048 B2
(45) Date of Patent: Dec. 25, 2018

(54) TIME-OF-FLIGHT DETECTION PIXEL

(71) Applicant: STMicroelectronics (Crolles 2) SAS, Crolles (FR)

(72) Inventors: Francois Roy, Seyssins (FR); Boris Rodrigues, Grenoble (FR); Marie Guillon, Fontanil-Cornillon (FR); Yvon Cazaux, Grenoble (FR); Benoit Giffard, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 36 days.

(21) Appl. No.: 15/392,032

(22) Filed: Dec. 28, 2016

(65) Prior Publication Data
US 2017/0194368 A1   Jul. 6, 2017

(30) Foreign Application Priority Data

Dec. 30, 2015   (FR) ...................................... 15 63457
Dec. 12, 2016   (FR) ...................................... 16 62341

(51) Int. Cl.
*G01S 7/48* (2006.01)
*H01L 27/146* (2006.01)
(Continued)

(52) U.S. Cl.
CPC .......... *G01S 7/4863* (2013.01); *G01S 7/4914* (2013.01); *H01L 27/1461* (2013.01);
(Continued)

(58) Field of Classification Search
CPC ......... H01L 27/14645; H01L 27/14612; H01L 27/14607; H01L 27/14683;
(Continued)

(56) References Cited

U.S. PATENT DOCUMENTS 7,436,496 B2 * 10/2008 Kawahito ............. G01S 7/4863
257/E31.054
7,595,827 B2 *  9/2009 Sato ....................... H04N 5/335
348/294

(Continued)

FOREIGN PATENT DOCUMENTS

EP          2881991 A1     6/2015

OTHER PUBLICATIONS

INPI Search Report and Written Opinion for FR 1662341 dated Jan. 10, 2018 (7 pages).

(Continued)

*Primary Examiner* — Timothy J Henn
(74) *Attorney, Agent, or Firm* — Crowe & Dunlevy

(57) ABSTRACT

A pixel is formed on a semiconductor substrate that includes a photosensitive area having a first doped layer and a charge collection area of a first conductivity type extending through at least part of the first doped layer. At least two charge storage areas, each including a well of the first conductivity type, are separated from the charge collection area at least by a first portion of the first layer. The first portion is covered by a first gate. Each charge storage area is laterally delimited by two insulated conductive electrodes. A second doped layer of the second conductivity type covers the charge collection area and the charge storage areas.

27 Claims, 6 Drawing Sheets

(51) Int. Cl.
*H04N 5/374* (2011.01)
*G01S 7/491* (2006.01)
*G01S 7/486* (2006.01)

(52) U.S. Cl.
CPC .. *H01L 27/14607* (2013.01); *H01L 27/14612* (2013.01); *H01L 27/14641* (2013.01); *H01L 27/14645* (2013.01); *H01L 27/14683* (2013.01); *H04N 5/374* (2013.01); *H01L 27/1463* (2013.01); *H01L 27/14625* (2013.01); *H01L 27/14643* (2013.01)

(58) Field of Classification Search
CPC ........... H01L 27/14641; H01L 27/1461; H01L 27/14625; H01L 27/1463; H01L 27/14643; G01S 7/4863; H04N 5/374; H04N 5/37452
See application file for complete search history.

(56) References Cited

U.S. PATENT DOCUMENTS

| | | | | |
|---|---|---|---|---|
| 8,184,191 | B2* | 5/2012 | Sugawa | H04N 5/2355 348/314 |
| 9,117,712 | B1 | 8/2015 | Oggier et al. | |
| 2007/0158770 | A1* | 7/2007 | Kawahito | G01S 7/4816 257/431 |
| 2008/0106625 | A1* | 5/2008 | Border | H04N 5/35572 348/296 |
| 2011/0019049 | A1 | 1/2011 | Jin et al. | |
| 2011/0180860 | A1* | 7/2011 | Yamada | H01L 27/1461 257/291 |
| 2013/0181119 | A1* | 7/2013 | Bikumandla | H01L 27/14612 250/214.1 |
| 2013/0228691 | A1* | 9/2013 | Shah | H01L 27/14614 250/341.8 |
| 2014/0347442 | A1* | 11/2014 | Wang | H04N 5/2256 348/46 |
| 2016/0043120 | A1* | 2/2016 | Ahn | H01L 27/1463 257/229 |
| 2016/0133659 | A1* | 5/2016 | Chao | H01L 27/14612 257/231 |
| 2017/0293031 | A1* | 10/2017 | Popp | G01S 7/4914 |

OTHER PUBLICATIONS

INPI Search Report and Written Opinion for FR 1563457 dated Sep. 8, 2016 (7 pages).

\* cited by examiner

TIME-OF-FLIGHT DETECTION PIXEL

PRIORITY CLAIM

This application claims the priority benefit of French Application for Patent No. 1563457 filed on Dec. 30, 2015, and French Application for Patent No. 1662341, filed on Dec. 12, 2016, the disclosures of which are hereby incorporated by reference in their entireties.

TECHNICAL FIELD

The present disclosure relates to a distance sensor operating based on the time-of-flight measurement principle, or TOF sensor.

BACKGROUND

In a TOF sensor, a light source emits light towards a scene. A time-of-flight detection pixel, or TOF pixel, of the sensor receives the light reflected by a point of the scene associated with this pixel. The measurement of the time of flight, that is, of the time taken by the light to travel from the light source to the point of the scene having the pixel associated therewith, and from this point back to the pixel, enables the distance separating the pixel from this point to be calculated.

In the case where a three-dimensional image of a scene is desired to be obtained, the TOF sensor comprises an array of TOF pixels for measuring the distance separating each pixel from the point of the scene having the pixel associated therewith. This provides a mapping of the distances separating the sensor from the different points of the scene having the pixels associated therewith, and a three-dimensional image of the scene can then be reconstructed from such a distance mapping. However, existing TOF pixels have relatively large dimensions. For example, a TOF pixel comprising a SPAD-type photodiode ("Single Photon Avalanche Diode") may have a surface area in the order of 30 μm*30 μm.

It would be desirable to provide a TOF pixel overcoming at least some of the disadvantages of existing TOF pixels. For example, it would be desirable to provide a TOF pixel having a surface area smaller than 10 μm*10 μm, and for example smaller than 5 μm*5 μm.

SUMMARY

An embodiment provides a time-of-flight detection pixel comprising a semiconductor substrate comprising: a photosensitive area comprising a first doped layer of a first conductivity type and a charge collection area of the first type more heavily doped than the first layer and extending through all or part of the first layer; at least two charge storage areas, each comprising a well of the first type more heavily doped than the charge collection area and separated from said charge collection area at least by a first portion of the first layer, the first portion being covered by a first gate, each charge storage area being laterally delimited by two insulated conductive electrodes, parallel to and facing each other; and a second doped layer of the second conductivity type covering the collection area and the charge storage areas.

According to an embodiment, each first portion of the first layer comprises a first intermediate area adjacent to the corresponding storage area, the first intermediate area being of the first doping type, more heavily doped than said first portion and less heavily doped than the well of said storage area.

According to an embodiment, each charge storage area comprises a second intermediate area, interposed between the well of the storage area and the photosensitive area, the second intermediate area being of the first doping type, more heavily doped than the first portion and less heavily doped than the well.

According to an embodiment, the photosensitive area is square-shaped in top view, and each storage area extends along an edge of the photosensitive area.

According to an embodiment, the photosensitive area is substantially square-shaped in top view, and each storage area extends from an edge of the photosensitive area, orthogonally to this edge.

According to an embodiment, the first layer is positioned on a portion of the substrate of the second doping type and having its doping level decreasing as the distance to the first layer decreases.

According to an embodiment, the pixel further comprises a reset area of the first type more heavily doped than the charge collection area, and separated from the charge collection area by a second portion of the first layer covered by a second gate arranged on the photosensitive area.

According to an embodiment, the first gates are arranged on the photosensitive area, and the charge collection area comprises a central portion arranged substantially at the center of the photosensitive area, and arms extending from the central portion, between the gates arranged on the photosensitive area.

According to an embodiment, the pixel further comprises, for each charge storage area, a sense area of the first type more heavily doped than the well, separated from the well by a third portion of the first layer covered by a third gate, the third portion being arranged beyond the photosensitive area.

According to an embodiment, the pixel is intended to receive a periodic light signal, the gates arranged on the photosensitive area being made of materials transparent to the wavelengths of the received periodic signal.

According to an embodiment, a screen opaque to light covers the pixel except for the photosensitive area.

According to an embodiment, each first gate is capable of receiving or not a first potential for allowing or forbidding a charge transfer from the photosensitive area to the corresponding storage area.

According to an embodiment, the semiconductor substrate is a semiconductor layer of semiconductor-on-insulator type.

Another embodiment provides an image sensor comprising an array of pixels such as hereabove associated with a source emitting a periodic light signal, and means capable of synchronizing said source and control potentials applied to the gates of transistors of each pixel.

Another embodiment provides a method of manufacturing a time-of-flight detection pixel comprising the successive steps of: forming pairs of vertical insulated electrodes parallel to and facing each other, each pair of electrodes laterally delimiting a storage area extending longitudinally from a photo-sensitive area; forming by implantation, in the photosensitive area, a first doped layer of a first conductivity type; on the photosensitive area, forming first gates on first portions of the first layer having the storage areas extending therefrom; in the photosensitive area, between the first gates, forming by implantation a charge collection area of the first type more heavily doped than the first layer, the collection area having edges aligned with the first gates; in each storage area, forming by implantation a well of the first type more heavily doped than the charge collection area; and on the storage areas and on the charge collection area, forming by implantation a second doped layer of the second type.

BRIEF DESCRIPTION OF THE DRAWINGS

The foregoing and other features and advantages will be discussed in detail in the following non-limiting description of specific embodiments in connection with the accompanying drawings, wherein:

FIGS. 4A to 4D schematically show an embodiment of a TOF pixel of the type in FIG. 2;

DETAILED DESCRIPTION

Figure 1:
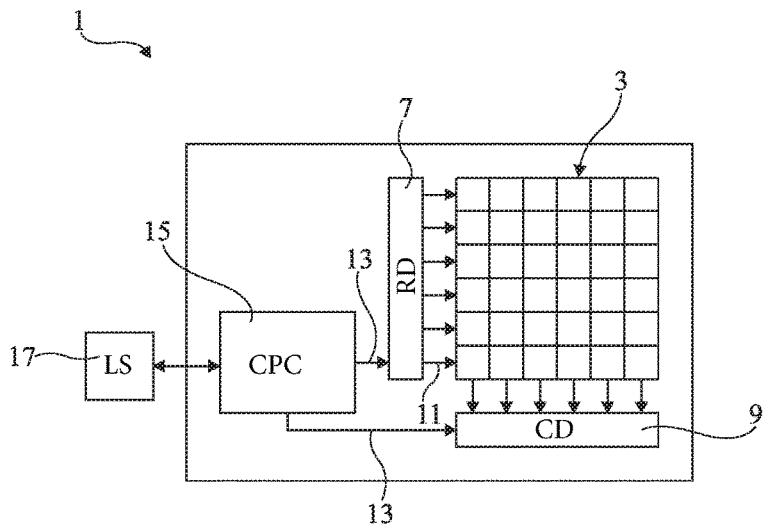
FIG. 1 is a top view schematically showing an example of a TOF sensor.

The same elements have been designated with the same reference numerals in the various drawings and, further, the various drawings are not to scale. For clarity, only those elements which are useful to the understanding of the described embodiments have been shown and detailed.

In the following description, terms "high", "low", "under", "over", "vertical", and "upper" refer to the concerned elements in the corresponding drawings. Unless otherwise specified, expressions "substantially", "approximately", and "in the order of" mean to within 10%, preferably to within 5%.

FIG. 1 is a simplified top view of an example of a TOF sensor. Sensor 1 comprises an array 3 of TOF pixels, for example, an array of 1,000 rows by 1,000 columns. Array 3 is associated with a row decoder (RD) 7 and with a column decoder (CD) 9. Row decoder 7 delivers signals 11 enabling to select one or the other of the array rows. Column decoder 9 enables to read the information from the pixels of a selected row. Row decoder 7 and column decoder 9 are controlled by signals 13 delivered by a control and processing circuit (CPC) 15.

Control and processing circuit 15 for example comprises a processor associated with one or a plurality of memories. Sensor 1 is associated with a light source (LS) 17 for illuminating a scene for which a three-dimensional image is desired to be obtained. Light source 17 is, for example, a laser having a wavelength which may be in the range from 500 to 1,000 nm. Light source 17 is connected to control and processing circuit 15 to synchronize the control signals applied to the TOF pixels of array 3 and light source 17.

In the following description, the case of a sensor 1 where light source 17 emits a sinusoidal signal $L_E$ having a frequency which may be in the range from 20 to 100 MHz, for example, 25 MHz, is considered. For each pixel, phase-shift $\rho$ between the emitted light signal $L_E$ and the light signal $L_R$ received by this pixel is determined. The distance separating the pixel from its conjugated point is then determined from phase shift $\varphi$.

Figure 2:
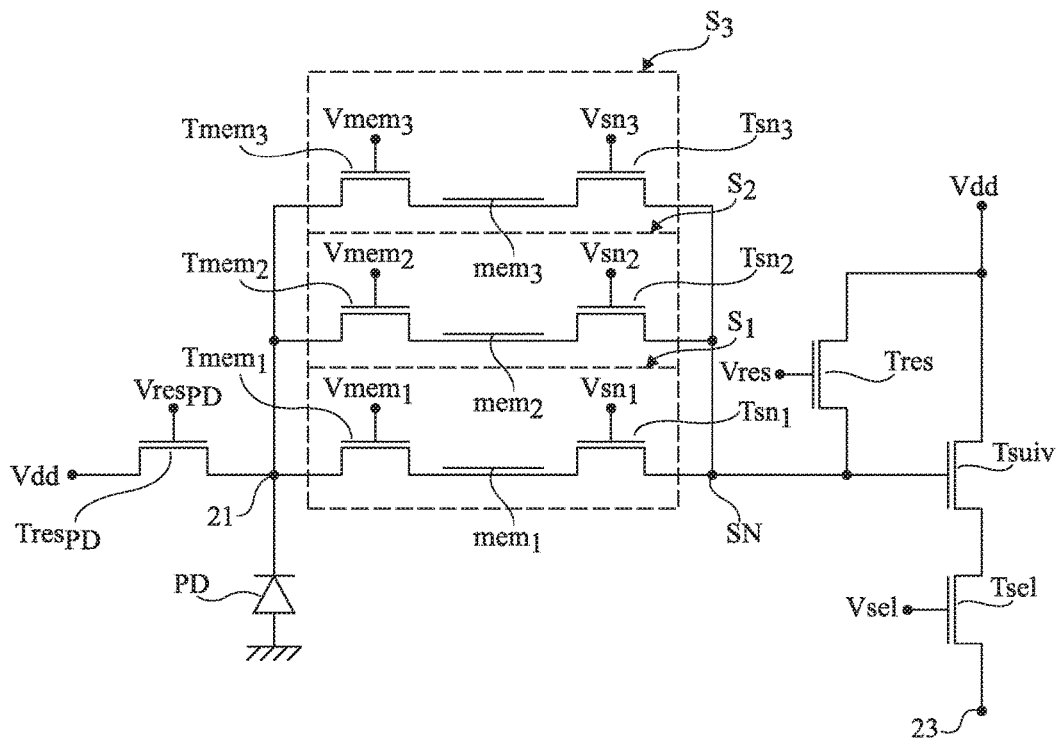
FIG. 2 shows an example of a TOF pixel circuit.

FIG. 2 shows an example of a TOF pixel circuit.

The TOF pixel comprises a photosensitive element (photo-diode) PD having a terminal connected to a node 21 and having its other terminal connected to a low reference potential, for example, the ground. Node 21 is coupled to sense node SN via three identical sets $S_1$, $S_2$, and $S_3$ connected in parallel between nodes 21 and SN. Each set $S_i$, with i equal to 1, 2, and 3 in this example, comprises a transfer N-channel MOS transistor, $Tmem_i$, a charge storage area $mem_i$, and a sense N-channel MOS transistor, $Tsn_i$. The source of transistor $Tmem_i$ is connected to node 21, and the drain of transistor $Tmem_i$ is connected to a terminal of storage area $mem_i$. Transistor $Tmem_i$ is controlled by a signal $Vmem_i$ applied to its gate. The source of transistor $Tsn_i$ is connected to the other terminal of storage area $mem_i$, and the drain of transistor $Tsn_i$ is connected to sense node SN. Transistor $Tsn_i$ is controlled by a signal $Vsn_i$ applied to its gate. Examples of storage areas $mem_i$ will be given hereafter.

The TOF pixel is associated with a sense device which may be common to a plurality of pixels, for example, four pixels. The sense device comprises a precharge N-channel MOS transistor, Tres, an N-channel MOS transistor assembled as a source follower, Tsuiv, and a selection N-channel MOS transistor, Tsel, connected as shown. Sense node SN is coupled by transistor Tres to a power supply rail set to a high reference potential, for example, power supply potential Vdd. Transistor Tres is controlled by a signal Vres applied to its gate. Sense node SN is also coupled to the gate of transistor Tsuiv having its drain coupled to the power supply rail, and having its source coupled to an output rail 23 of the pixel circuit via transistor Tsel, transistor Tsel being controlled by a signal Vsel applied to its gate.

In this example, the TOF pixel further comprises an N-channel MOS transistor, $Tres_{PD}$, for resetting photosensitive element PD. The source of transistor $Tres_{PD}$ is connected to node 21 and the drain of transistor $Tres_{PD}$ is connected to power supply rail Vdd. Transistor $Tres_{PD}$ is controlled by a signal $Vres_{PD}$ applied to its gate.

To determine the phase shift $\varphi$ between the emitted light signal $L_E$ and the light signal $L_R$ received by the pixel, signal $L_R$ is sampled by transferring, successively and at regular intervals, charges photogenerated in the photosensitive element towards storage areas $mem_1$, and then $mem_2$, and finally $mem_3$. The total time necessary to carry out these three successive transfers is equal to a period of signals $L_E$ and $L_R$. Further, these three successive transfers are repeated a large number of times, for example, at least 100,000 times. The charges stored in the storage areas are then read by transferring, to node SN, the charges from area $mem_1$, and then from area $mem_2$, and finally from area $mem_3$.

An embodiment of the TOF pixel of FIG. 2 will now be described in further detail in relation with FIG. 3.

Figure 3:
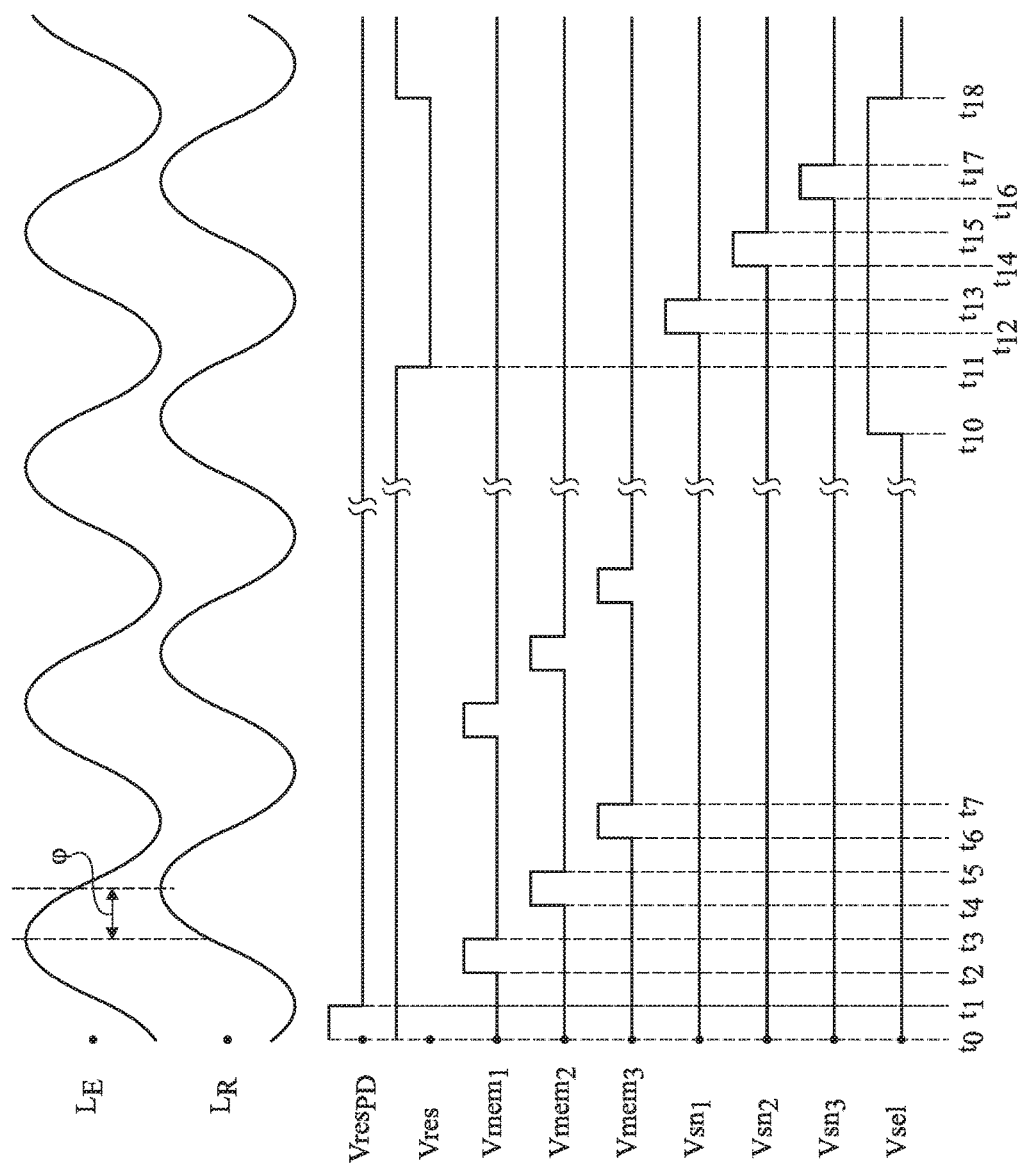
FIG. 3 is a timing diagram illustrating a control mode for the TOF pixel of FIG. 2.

FIG. 3 is a timing diagram of light signal $L_E$ emitted by light source 17 associated with sensor 1, of light signal $L_R$ received by the TOF pixel, and of digital signals $Vres_{PD}$, Vres, $Vmem_i$, $Vsn_i$, and Vsel. By default, signals $Vres_{PD}$, $Vmem_i$, $Vsn_i$, and Vsel are at a low level and signal Vres is at a high level.

A resetting of photosensitive element PD is first performed by setting transistor $Tres_{PD}$ to the on state (signal $Vres_{PD}$ in the high state) between times $t_0$ and $t_1$. An integration cycle of the pixel then starts and is synchronized on signal $L_E$.

During the integration cycle, the charges photogenerated in photosensitive area PD are transferred to storage areas $mem_i$. To achieve this, transfer transistors $Tmem_i$ are each set to the on state in turn. More particularly, transistor Tmem$_1$ is set to the on state (Vmem$_1$ high) between times t$_2$ and t$_3$, transistor Tmem$_2$ is set to the on state (Vmem$_2$ high) between times t$_4$ and t$_5$, and transistor Tmem$_3$ is set to the on state (Vmem$_3$ high) between times t$_6$ and t$_7$. As previously indicated, these three transfers are then repeated a large number of times. All along the integration cycle, signal Vres is in the high state, transistor Tres is on, and the voltage of sense node SN is substantially equal to the high reference potential.

At the end of the integration cycle, from a time t$_{10}$, the charges stored in each of storage areas mem$_i$ are read. To achieve this, sense transistors Tsn$_i$ are each in turn set to the on state, and the voltage level on node SN is measured and stored after each reading of the charges stored in a storage area mem$_i$. More particularly, transistor Tsel is set to the on state (Vsel high) at time t$_{10}$ and precharge transistor Tres is set to the off state (Vres low) at a time t$_{11}$. Transistor Tsn$_1$ is then set to the on state (Vsn$_1$ high) between successive times t$_{12}$ and t$_{13}$, followed by the setting to the on state of transistor Tsn$_2$ (Vsn$_2$ high) between successive times t$_{14}$ and t$_{15}$, followed by the setting to the on state of transistor Tsn$_3$ (Vsn$_3$ high) between successive times t$_{16}$ and t$_{17}$. First, second, and third voltage levels of node SN are measured and stored, respectively between times t$_{13}$ and t$_{14}$, between times t$_{15}$ and t$_{16}$, and between times t$_{17}$ and a time t$_{18}$. At time t$_{18}$, signal Vsel is set to the low state and signal Vres is set back to the high state. A new integration cycle may then start.

In this embodiment, the first, second, and third measured voltage levels are representative of the charges stored, respectively, in storage area mem$_1$, in storage areas mem$_1$ and mem$_2$, and in storage areas mem$_1$, mem$_2$, and mem$_3$. In an alternative embodiment, a resetting of sense node SN is provided, by the application of a high-potential pulse on transistor Tres, after each reading of the charges stored in a storage area mem$_i$. In this case, the first, second, and third voltage levels are representative of the charges stored in a single storage area, respectively mem$_1$, mem$_2$, and mem$_3$.

These three voltage levels enable to determine phase shift φ between light signals L$_E$ and L$_R$, and thus to deduce therefrom the distance separating the pixel from the point in the scene associated with the pixel.

Although an embodiment and a control mode of a TOF pixel circuit comprising three identical sets S$_i$ has been described, phase shift φ between signals L$_E$ and L$_R$ may also be determined by using a TOF pixel comprising more than three sets S$_i$, for example, four sets S$_i$.

As an example, the time taken by a transfer towards a storage area mem$_i$ is in the range from 5 to 30 ns. The time separating two transfers to a same storage area mem$_i$ is for example 40 ns when the frequency of these signals is 25 MHz. In this case, the time taken by an integration cycle may be approximately 10 ms when the charge transfers to each of storage areas mem$_i$ are performed 250,000 times each. The time taken by a charge transfer from a storage area mem$_i$ to sense node SN is for example in the range from 1 to 10 μs.

In a pixel, within a few nanoseconds, few charges are photogenerated in photosensitive element PD, for example, from 0 to 10 charges. Such charges should be integrally transferred to a storage area mem$_i$. In particular, no charge should remain blocked in photosensitive element PD or in the channel of the corresponding transistor Tmem$_i$.

An embodiment of a TOF pixel allowing a complete transfer of the charges photogenerated in photosensitive area PD towards storage areas mem$_i$ will now be described in relation with FIGS. 4A, 4B, 4C, and 4D.

Figure 4D:
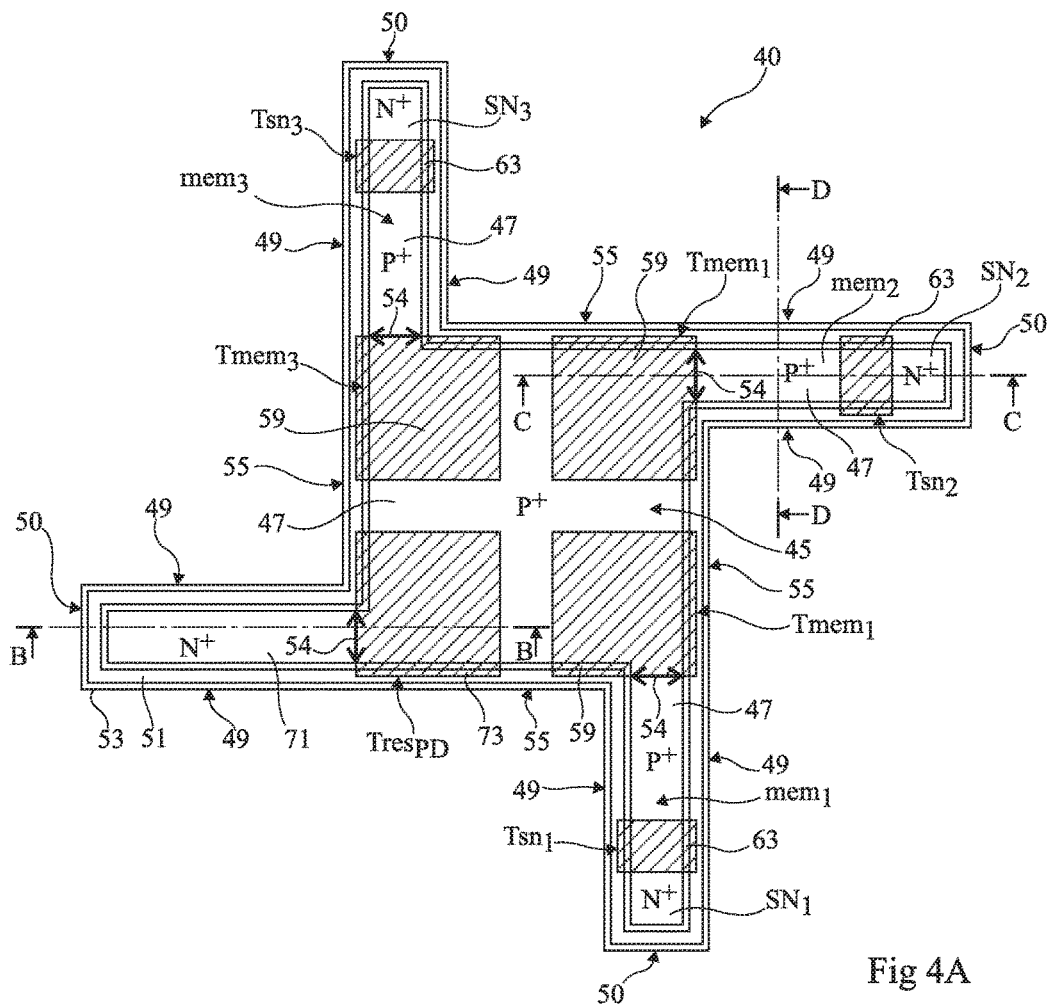
Figure 4D:
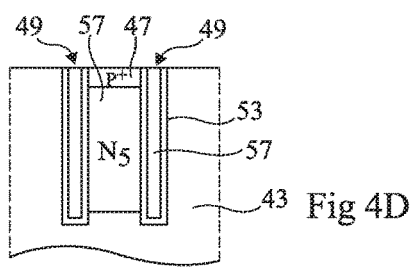
Figure 4B:
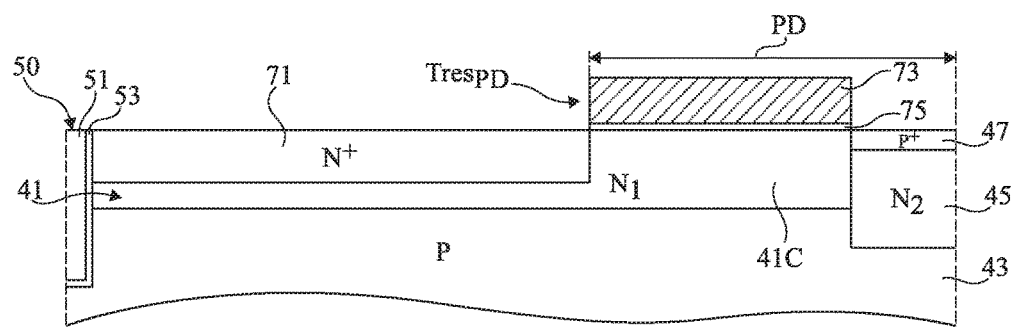
Figure 4C:
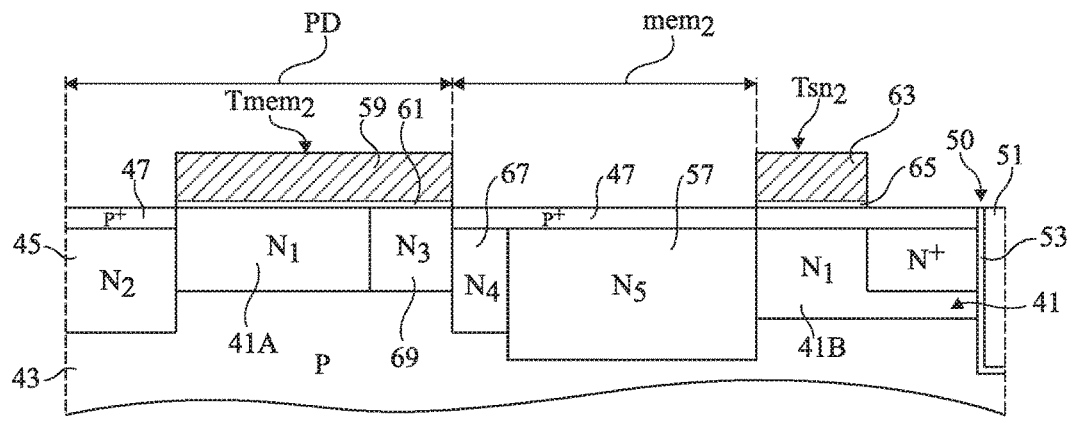

FIGS. 4A to 4D schematically show an embodiment of a TOF pixel 40, FIG. 4A being a top view of the pixel and FIGS. 4B, 4C, and 4D being cross-section views respectively along planes BB, CC, and DD of FIG. 4A. In this embodiment, the pixel comprises three sets S$_i$, with i equal to 1, 2, and 3, and one reset transistor Tres$_{PD}$. Each set S$_i$ comprises a transfer transistor Tmem$_i$, a storage area mem$_i$, and a sense transistor Tsn$_i$. Each set S$_i$ is associated with a sense area SN$_i$.

TOF pixel 40 comprises a photosensitive area PD, for example, of square shape in top view. As illustrated in FIG. 4C, photosensitive area PD comprises an N-type doped layer 41, of doping level N$_1$. N$_1$ layer 41 is formed at the upper surface of a P-type doped semiconductor substrate 43 having a doping level which may decrease as the distance to N$_1$ layer 41 decreases.

As illustrated in FIG. 4C, TOF pixel 40 also comprises, in photosensitive area PD, an N-type doped charge collection area 45, having a doping level N$_2$ greater than N$_1$. N$_2$ layer 45 is covered by a heavily-doped P-type layer 47 (P$^+$). N$_2$ layer 45 extends through all or part of the thickness of N$_1$ layer 41. In this example, N$_2$ charge collection area 45 penetrates into P substrate 43 deeper than N$_1$ layer 41.

As illustrated in FIG. 4C, each sense area SN$_i$ is heavily N-type doped (N$^+$) and is formed in N$_1$ layer 41, beyond photosensitive area PD. Sense areas SN$_i$ correspond to sense node SN described in relation with FIG. 2 and may be electrically connected to one another.

As illustrated in FIGS. 4A and 4D, each storage area mem$_i$ extends widthwise between two insulated vertical electrodes 49, parallel to and facing each other, and lengthwise from photosensitive area PD to a corresponding sense area SN$_i$. Electrodes 49 delimiting each storage area mem$_i$ may comprise an extension 50 entirely delimiting the corresponding N$^+$ area SN$_i$, except for the edge on the side of area mem$_i$. As illustrated in FIG. 4C, insulated vertical electrodes 49, 50 extend from the upper surface of pixel 40, cross N$_1$ layer 41, and penetrate into P substrate 43. Insulated vertical electrodes 49 comprise a conductive material 51, for example, doped polysilicon, bordered with an insulating layer 53, for example, made of silicon oxide.

In this embodiment, as illustrated in FIG. 4A, each storage area mem$_i$ extends lengthwise from an opening 54 in an edge of photosensitive area PD, orthogonally to this edge. Further, each storage area mem$_i$ has a large side aligned with an edge of photosensitive area PD, so that each storage area mem$_i$ extends from a corner of photosensitive area PD. Advantageously, the insulated vertical electrodes 49 delimiting storage areas mem$_i$ may comprise extensions 55, which delimit photosensitive area PD.

Each storage area mem$_i$ comprises, as illustrated in FIGS. 4C and 4D, an N-type doped well 57, having a doping level N$_5$ greater than N$_1$, covered by P$^+$ layer 47 and laterally delimited by corresponding vertical insulating electrodes 49. Each N$_5$ well 57 penetrates into substrate 43 down to a depth greater than or equal to that of N$_1$ layer 41 and smaller than that of insulated electrodes 49, 50, 55. Each storage area mem$_i$ is separated from N$_2$ charge collection area 45 by a portion 41A of N$_1$ layer 41. Each N$_1$ portion 41A of photosensitive area PD is entirely covered by gate 59 of the corresponding transfer transistor Tmem$_i$, gate 59 being separated from N$_1$ portion 41A by a gate insulator layer 61. Each of storage areas mem$_i$ is separated from the corresponding area SN$_i$ by a portion 41B of N$_1$ layer 41. N$_1$ portion 41B is arranged outside of the photosensitive area and is entirely coated with gate 63 of the corresponding sense transistor $Tsn_i$, gate 63 being separated from $N_1$ portion 41B by a gate insulator layer 65.

In this embodiment, as illustrated in FIG. 4C, each area $mem_i$ comprises an N-type doped area 67, having a doping level $N_4$ greater than $N_1$ and smaller than $N_5$, covered by $P^+$ layer 47, and adjacent to photosensitive area PD. Each $N_4$ area 67 penetrates into P substrate 43, for example down to a depth greater than or equal to that of $N_1$ layer 41 and smaller than or equal to that of $N_5$ wells 57. Further, each $N_1$ portion 41A comprises an N-type doped 69, having a doping level $N_3$ greater than $N_1$ and smaller than $N_4$, $N_5$ and $N_2$, covered by gate 59 of the corresponding transistor $Tmem_i$, and adjacent to a corresponding storage area $mem_i$. The $N_3$ areas 69 penetrate into P substrate 43, for example, down to a depth substantially equal to that of $N_1$ layer 41. Thus, from $N_2$ charge collection area 45 and all the way to a sense area $SN_i$, one can successively find, in contact two by two, $N_2$ charge collection area 45, an $N_1$ portion 41A, an $N_3$ area 69, an $N_4$ area 67, an $N_5$ well 57, an $N_1$ portion 41B, and sense area $SN_i$.

Reset transistor $Tres_{PD}$ comprises a heavily N-type doped drain area 71 ($N^+$) formed outside of photosensitive area PD, for example, in $N_1$ layer 41. $N^+$ area 71 extends widthwise between two insulated vertical electrodes 49, parallel to and facing each other, and lengthwise from photosensitive area PD. $N^+$ area 71 is separated from $N_2$ charge collection area 45 by a portion 41C of $N_1$ layer 41 as illustrated in FIG. 4B. $N_1$ portion 41C of photosensitive area PD is covered by gate 73 of transistor $Tres_{PD}$, gate 73 being separated from this $N_1$ portion 41C of photosensitive area PD by a gate insulator layer 75.

In this embodiment, as illustrated in FIG. 4A, and similarly to storage areas $mem_i$, $N^+$ area 71 of transistor $Tres_{PD}$ extends lengthwise from an opening 54 in an edge of photosensitive area PD, orthogonally to this edge, and has a large side aligned with another edge of photosensitive area PD, so that $N^+$ area 71 extends from a corner of photosensitive area PD. Advantageously, insulated vertical electrodes 49 delimiting $N^+$ area 71 may comprise extensions 55 which delimit photosensitive area PD, and an extension 50 delimiting the small side of $N^+$ area 71 opposite to photosensitive area PD.

In this embodiment, as shown in FIG. 4A, charge collection area 45 has the shape of a cross comprising a central portion arranged at the center of the photosensitive area, and arms extending from this central portion, between gates 59, 73 resting on photosensitive area. The thicknesses and the materials of the gates of transistors $Tmem_i$ and $Tres_{PD}$ may then be selected so that these gates are transparent to the radiations of the light signal $L_R$ received by the pixel. Thereby, signal $L_R$ may reach photosensitive area PD after having crossed the gates of transistors $Tmem_i$ and $Tres_{PD}$. For example, polysilicon gates 59 and 73 having a thickness in the range from 150 nm to 600 nm, and silicon oxide gate insulators 61, 75 having a thickness in the range from 3 to 12 nm are transparent to a near-infrared signal $L_R$ having a wavelength in the range from 800 to 1,000 nm. Further, such thicknesses and materials may advantageously not be transparent to parasitic luminous radiations having wavelengths distant from those of signal $L_R$. This enables to filter at least part of the parasitic radiations. For example, the gates and the gate insulators indicated hereabove as an example absorb at least a portion of parasitic luminous radiations in the visible spectrum having wavelengths in the range from 400 to 700 nm.

A shield opaque to light (not shown), for example, made of a metal such as tungsten, aluminum, or copper, is provided above areas $mem_i$, areas $SN_i$, and possibly the gates of transistors $Tsn_i$ so that the radiations of luminous signal $L_R$ only reach photosensitive area PD of the pixel. This advantageously enables to avoid the photogeneration of parasitic charges in the storage areas. The opaque shield arranged on each area $mem_i$ may further extend over all or part of gate 59 of the corresponding transistor $Tmem_i$. In particular, the shield may further extend over a portion of gate 59 of transistor $Tmem_i$ totally covering $N_3$ portion 69 and over a portion, adjacent to $N_3$ portion 69, of $N_1$ portion 41A to avoid for charges to be photogenerated therein and then transferred to the adjacent storage area $mem_i$ while they should be transferred to another storage area $mem_i$.

To manufacture the TOF pixel of FIGS. 4A to 4C, according to an embodiment and referring to FIG. 4C, it is started from a substrate 43 corresponding to a doped P-type silicon wafer or of a substrate obtained by epitaxy of P-type in-situ doped silicon, the dopant atom concentration may vary during the epitaxy to obtain a doping gradient such as previously described. Insulated vertical electrodes 59 and their extensions 50, 55 are simultaneously formed from a same trench with insulated walls (insulator 53) filled with conductive material 51. $N_1$ layer 41 and $N_3$ area 69 are then formed during steps of masking and dopant atom implantation, for example, with doses of dopant atoms in the range from $5*10^{11}$ to $5*10^{13}$ at·cm$^{-2}$. Although in the embodiment described herein, areas 41B and 41C have a doping level $N_1$, it may be provided for these areas to have a doping level $N_3$ by adapting the layout of the masks used during the forming of $N_3$ area 69. The gates of transistors $Tsn_i$, $Tres_{PD}$, and $Tmem_i$ are then formed on the substrate, after which $N_4$ area 67, $N_2$ area 45, $N^+$ area $SN_i$, and $N^+$ area 71, and $N_5$ wells 57 are formed during steps of masking and dopant atom implantation, for example, with doses of dopant atoms in the range from $5*10^{11}$ to $5*10^{13}$ at·cm$^{-2}$. $P^+$ layer 47 is finally formed by implantation.

Due to the fact that $N_4$ area 67, $N_2$ area 45, $N^+$ area $SN_i$, and $N^+$ area 71, and $N_5$ wells 57 are formed after the gates of transistors $Tmem_i$, $Tsn_i$ and $Tres_{PD}$, these areas and wells advantageously have edges aligned with these gates. In particular, $N_2$ area 45 occupies the entire surface of photosensitive area PD which is not covered by gates 59 and 73. Storage areas $mem_i$ each have a small side aligned with an edge of a gate 59, this small side corresponding to a portion of an edge of photosensitive area PD, more particularly to opening 54 in this edge. $N^+$ area 71 of transistor $Tres_{PD}$ has a small side aligned with an edge of gate 73, this small side corresponding to a portion of an edge of photosensitive area PD, more particularly to opening 54 in this edge.

Further, due to the fact that $P^+$ layer 47 is formed after the gates of transistors $Tsn_i$, $Tmem_i$, and $Tres_{PD}$, the $P^+$ layer is not formed under the gates of these transistors, but only around these gates, over the entire charge collection area 51 and storage areas $mem_i$. Charge transfers under these gates 59, 73 are then advantageously performed bulkwise. As a result, the transferred charges do not reach gate insulators 61, 65, or 75 where they could have remained trapped, and all the charges of photosensitive area PD are effectively transferred to areas $mem_i$.

To suppress possible parasitic charge exchanges between two neighboring pixels, substrate 43 may correspond to a semiconductor layer resting on an insulating layer (substrate of semiconductor-on-insulator type), and electrodes 49, 50, 55 may then be formed through the entire thickness of $N_1$ layer 41 and of P substrate 43 to electrically insulate the photosensitive areas from one another.

In operation, insulated electrodes 49 and their extensions 50, 55 are connected to a negative or zero potential so that holes are stored along their walls. This enables to decrease dark currents, and to set $P^+$ layer 47 and P substrate 43 to a same low reference potential, for example, the ground, applied to substrate 43 or to layer 47. Photosensitive PD and storage areas $mem_i$ then correspond to so-called "pinned" diodes. The doping levels of photosensitive area PD and of storage areas $mem_i$ are selected so that, in the absence of illumination, the pinned diodes are fully depleted. Further, as described in relation with FIG. 2, a positive potential such as power supply potential Vdd is applied to drain area 71 of transistor $Tres_{PD}$.

Figure 5A:
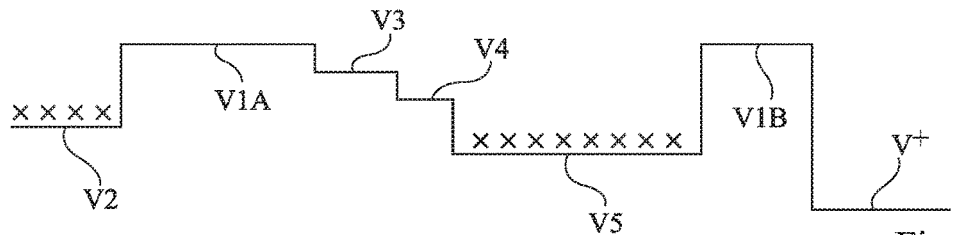
FIGS. 5A to 5D schematically illustrate the variation of the electrostatic potentials in various regions of the pixel of FIGS. 4A to 4D during charge transfer steps.
Figure 5B:
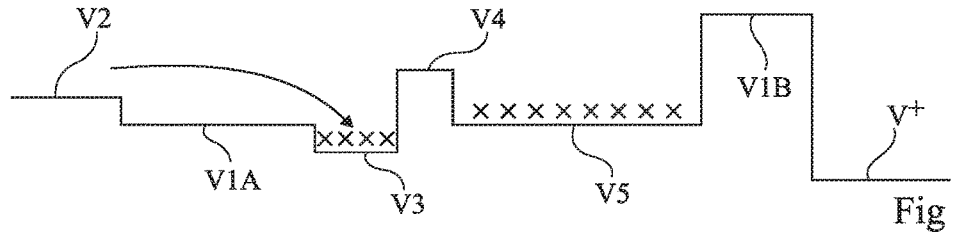
Figure 5C:
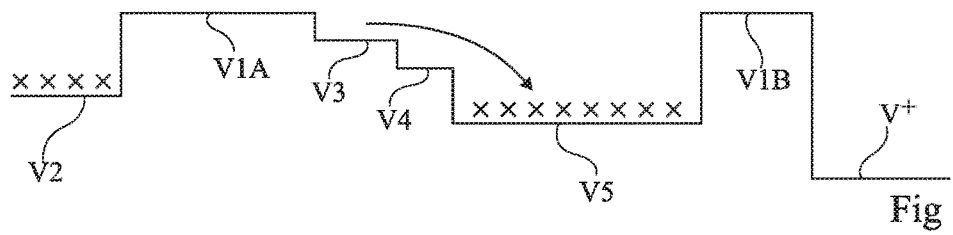
Figure 5D:
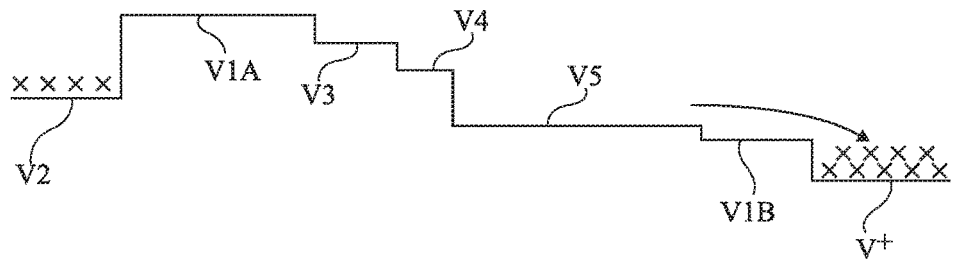

FIGS. 5A to 5D schematically show, according to the control potentials applied to transistors $Tmem_i$ and $Tsn_i$, the variation in plane CC of FIG. 4A of the levels of the electrostatic potentials in photosensitive area PD, under the gates of transistors $Tmem_i$ and $Tsn_i$, and in storage areas $mem_i$. More particularly, FIGS. 5A to 5C illustrate a step of charge transfer from photosensitive area PD to a storage area $mem_i$, and FIG. 5D illustrates a step of charge transfer from area $mem_i$ to the corresponding sense area $SN_i$. In these drawings, the electrostatic potentials are increasing from top to bottom.

At the step of FIG. 5A, transistors $Tmem_i$ and $Tsn_i$ are maintained in the off state by applying negative or zero potentials to their gates, for example, the ground potential. Due to the fact that doping levels $N_1$, $N_3$, $N_4$, $N_5$, $N^+$ are increasing, electrostatic potentials V1A and V1B, V3, V4, V5 and $V^+$, respectively in portions 41A and 41B, $N_3$ area 69, $N_4$ area 67, $N_5$ well 57, and area $SN_i$, are increasing. Further, doping level $N_2$ being greater than levels $N_1$ and $N_3$, electrostatic potential V2 in the charge collection area is greater than electrostatic potentials V1A and V3.

When the pixel receives light, electron-hole pairs are photogenerated in photosensitive area PD. The holes are drained off towards the low reference potential and the electrons (represented by crosses in the drawings) are stored in photosensitive area PD. Due to the fact that potential V2 is greater than potential V1A, the photogenerated electrons are drained towards $N_2$ charge collection area 45 where they accumulate. $N_2$ area 45 is selected to be sufficiently thick to allow the storage of electrons in the volume of this $N_2$ area 45 before their transfer to a storage area $mem_i$. Such a draining of electrons to $N_2$ area 45 is more efficient when substrate 43 has a doping level gradient such as previously described and/or when $N_2$ charge collection area 45 penetrates into the substrate more deeply than $N_1$ layer 41.

At the step of FIG. 5B, transistor $Tmem_i$ is set to the on state by application of a positive potential on its gate 59 so that potential V1A and potential V3 become greater than potentials V2 and V4. The gate entirely covering $N_1$ portion 41A and $N_3$ area 69, potential V1A remains lower than potential V3. The electrons stored in $N_2$ charge collection area 45 are thus all transferred to $N_3$ area 69, where they are temporarily stored due to their being blocked between potential barriers V1A and V4. Further, due to the fact that potential V4 is smaller than potential V5, the electrons which have already been transferred into storage area $mem_i$ remain confined in $N_5$ well 57 although, in this example, potential V3 is greater than potential V5.

Advantageously, due to the fact that the gate of transistor $Tmem_i$ covers a portion of photosensitive area PD, it contributes to attracting the photogenerated electrons present in photosensitive area PD to the upper surface of the pixel, before their transfers to $N_3$ area 69. As a result, no photogenerated electron remains in photosensitive area PD.

At the step of FIG. 5C, transistor $Tmem_i$ is set back to the off state, whereby potentials V1A and V3 become smaller than potentials V4 and V5 again. Further, potential V1A remains greater than V3. As a result, the electrons which were in $N_3$ area 69 are all transferred to the corresponding $N_5$ well 57, through $N_4$ area 67. Advantageously, potential V1A forms a potential barrier preventing the returning of electrons from $N_3$ area 69 to $N_2$ charge collection area 45. The electron storage capacity in $N_5$ well 57 depends on the depth of the potential well, and particularly on the difference between potential V5 and potentials V1B and V4, which form potential barriers around $N_5$ well 57. Such a storage capacity may advantageously be adapted by modifying potential levels V1B and V4 with respect to potential level V5. For example, a decrease in doping levels $N_1$ of portion 41B and $N_4$ of portion 69 causes a greater difference between potential V5 and potentials V1B and V4, and thus an increase in the electron storage capacity in $N_5$ well 57. This storage capacity may also be increased by increasing doping level $N_5$ of well 57, by decreasing the bias potential applied to electrodes 49, and/or by modifying the well dimensions. In particular, the electrons being stored in the volume of $N_5$ wells 57, these wells are selected to have a sufficiently large thickness to be able to store a given amount of electrons. Further, the thickness of the wells is selected to be smaller than or equal to that of insulated electrodes 49, 50, and 55 which control the electrostatic confinement of electrons in these wells.

At the step of FIG. 5D, transistor $Tsn_i$ is set to the on state by application of a positive potential on its gate 63 so that potential V1B becomes greater than potentials V5 and remains smaller than potential $V^+$. The electrons are then transferred from area $mem_i$ to sense area $SN_i$. Transistor $Tsn_i$ is then set to the off state, and the quantity of photogenerated electrons transferred into area $SN_i$ may be read by the read circuit connected to area $SN_i$.

As concerns transistor $Tres_{PD}$, when it is maintained in the off state by application of a negative or zero potential on its gate 73, for example, the ground potential, the photogenerated electrons remain in the $N_2$ charge collection area 45 of photosensitive area PD. Indeed, due to the fact that doping level $N_1$ is smaller than doping level $N_2$, electrostatic potential V1C in $N_1$ portion 41C covered by gate 73 of transistor $Tres_{PD}$ is smaller than potential V2 in $N_2$ charge collection area 45. When transistor $Tres_{PD}$ is set to the on state by application of a positive potential on its gate 73, this potential is selected so that potential level V1C in $N_1$ portion 41C becomes greater than potential V2 and remains smaller than the potential applied to drain area 71 of transistor $Tres_{PD}$. As a result, the photogenerated electrons present in photosensitive area PD are all drained off from the pixel to potential Vdd.

In an alternative embodiment, the potential applied to the gate of transistor $Tres_{PD}$ in the off state may be selected to be greater than that applied to the gates of transistors $Tmem_i$ in the off state so that, when these transistors are in the off state, potential V1C is greater than potential V1A. Thereby, an excess of photogenerated electrons in photosensitive area PD will be drained off to $N^+$ region 71 rather than to a storage area $mem_i$. Transistor $Tres_{PD}$ may thus advantageously be used as an anti-dazzle transistor in addition to being used as a transistor for resetting photosensitive area PD.

It should be understood from the above-described operation that $N_1$ layer 41 mainly is a charge transfer layer close to the surface, from $N_2$ charge collection area 45 to storage areas $mem_i$, and, in this example, from areas $mem_i$ to $N^+$ areas $SN_i$ and 71. The thickness of $N_1$ layer 41 may thus be selected to be lower than those of $N_5$ wells 57 and of $N_2$ area 47. Similarly, $N_3$ areas 69 each have as a main function to enable the charge transfer from the photosensitive area to the corresponding memory area $mem_i$. The thickness of $N_3$ area 69 can then be selected to be substantially equal to that of $N_1$ layer 41. It should further be understood that $N_4$ areas 67 have as a main function to allow the charge transfer from $N_1$ area 41A and $N_3$ area 69 to an $N_5$ well 57 when the corresponding transistor $Tmem_i$ is in the on state, and to prevent the flowing of charges from an $N_5$ well 57 to $N_3$ area 69 and $N_1$ area 41A when the corresponding transistor $Tmem_i$ is in the off state. The thickness of $N_4$ area 67 may then be selected to be greater than the thickness of $N_1$ area 41A and $N_3$ area 69 and smaller than or equal to that of $N_5$ wells 47. As an example, transistor $Tmem_i$ switches at high frequency between the on state and the off state, for example, at a 25-MHz frequency.

Figure 6:
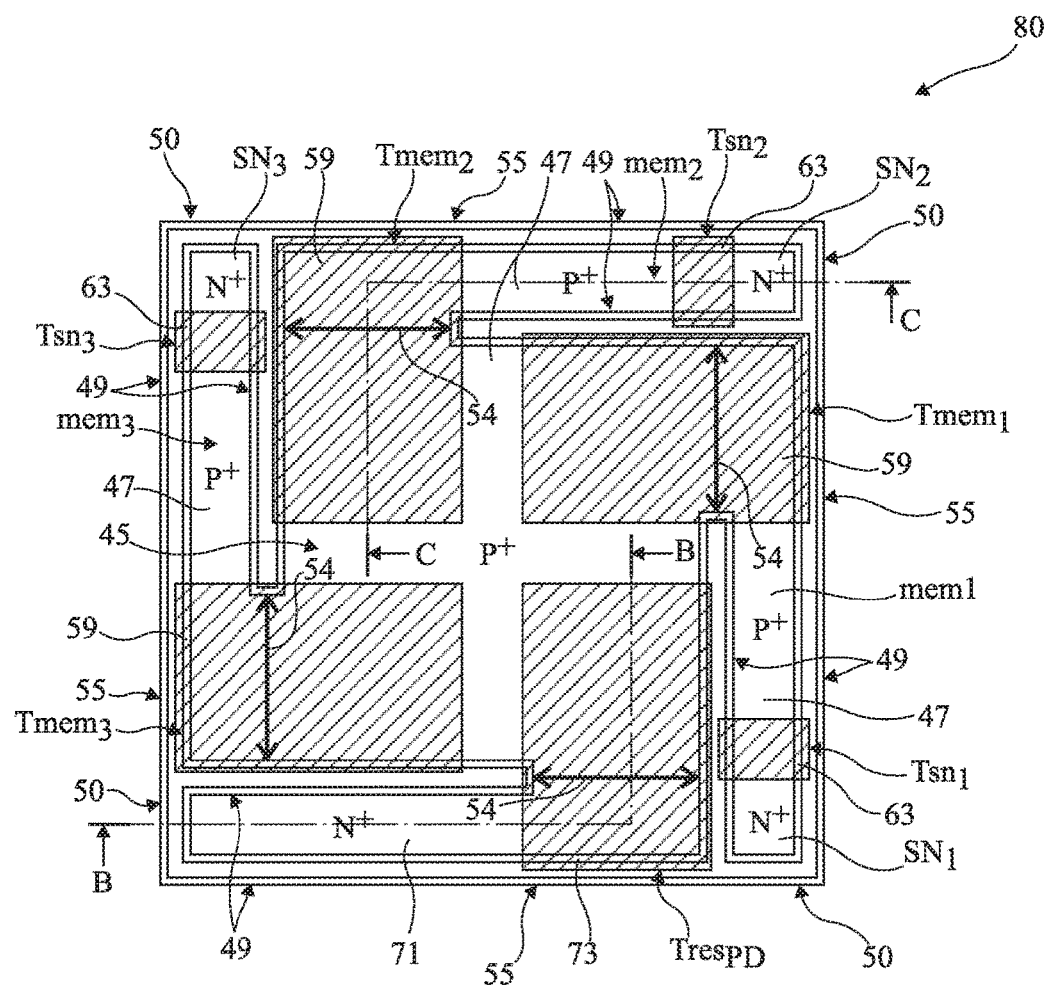
FIG. 6 schematically shows an alternative embodiment of the pixel of FIGS. 4A to 4D.

FIG. 6 is a simplified top view of an alternative embodiment of the TOF pixel of FIGS. 4A to 4C.

TOF pixel 80 of FIG. 6 comprises the same elements as TOF pixel 40 of FIGS. 4A to 4C, except that the $N^+$ drain 71 of transistor $Tres_{PD}$ and the assemblies of two associated areas $mem_i$ and $SN_i$ are not arranged in the same way relative to photosensitive area PD. In this alternative embodiment, $N^+$ drain 71 and assemblies $mem_i$, $SN_i$ each extend along an edge of a square central portion of photosensitive area PD, rather than orthogonally to this edge as described in relation with FIGS. 4A to 4C.

For each transistor $Tmem_i$, gate 59 and the portion of the photosensitive area PD that it coats extend through opening 54 in the side of photosensitive area PD bordered with the corresponding area $mem_i$, so that gate 59 has an edge adjacent to a small side of area $mem_i$. Similarly, gate 73 of transistor $Tres_{PD}$ and the portion of photosensitive area PD that it coats extend through opening 54 in the side of photosensitive area PD bordered with $N^+$ drain area 71 of transistor $Tres_{PD}$, so that gate 73 has an edge adjacent to a small side of this $N^+$ area 71.

Thus, the cross-section view along broken line BB of FIG. 6, running through $N^+$ area 71, gate 73, and collection area 45, and the cross-section view along broken line CC, running through an area $Sn_i$, a gate 63, an area $mem_i$, a gate 59, and area 45, are identical to the cross-section views, respectively along planes BB and CC of FIG. 4A, illustrated in FIGS. 4B and 4C.

In this variation, each electrode 49, 50 delimiting, on the side of photosensitive area PD, a large side of an assembly $mem_i$, $Sn_i$ or a large side of $N^+$ area 71, also partially delimits an edge of the photosensitive area. Further, each electrode 49, 50 delimiting, on the side opposite to photosensitive area PD, the other large side of an assembly $mem_i$, $SN_i$ or the other large side of $N^+$ area 71, comprises a rectilinear extension 55 all the way to a neighboring assembly $mem_i$, $SN_i$ or to $N^+$ area 71. More particularly, each extension 55 is aligned with an end of a neighboring assembly $SN_i$, $mem_i$ or with an end of $N^+$ area 71. Thus, pixel 80 is square-shaped, which simplifies the forming of an array comprising a plurality of pixels 80 organized in rows and in columns.

The operation of pixel 80, similar to that of pixel 40, will not be detailed.

Figure 7:
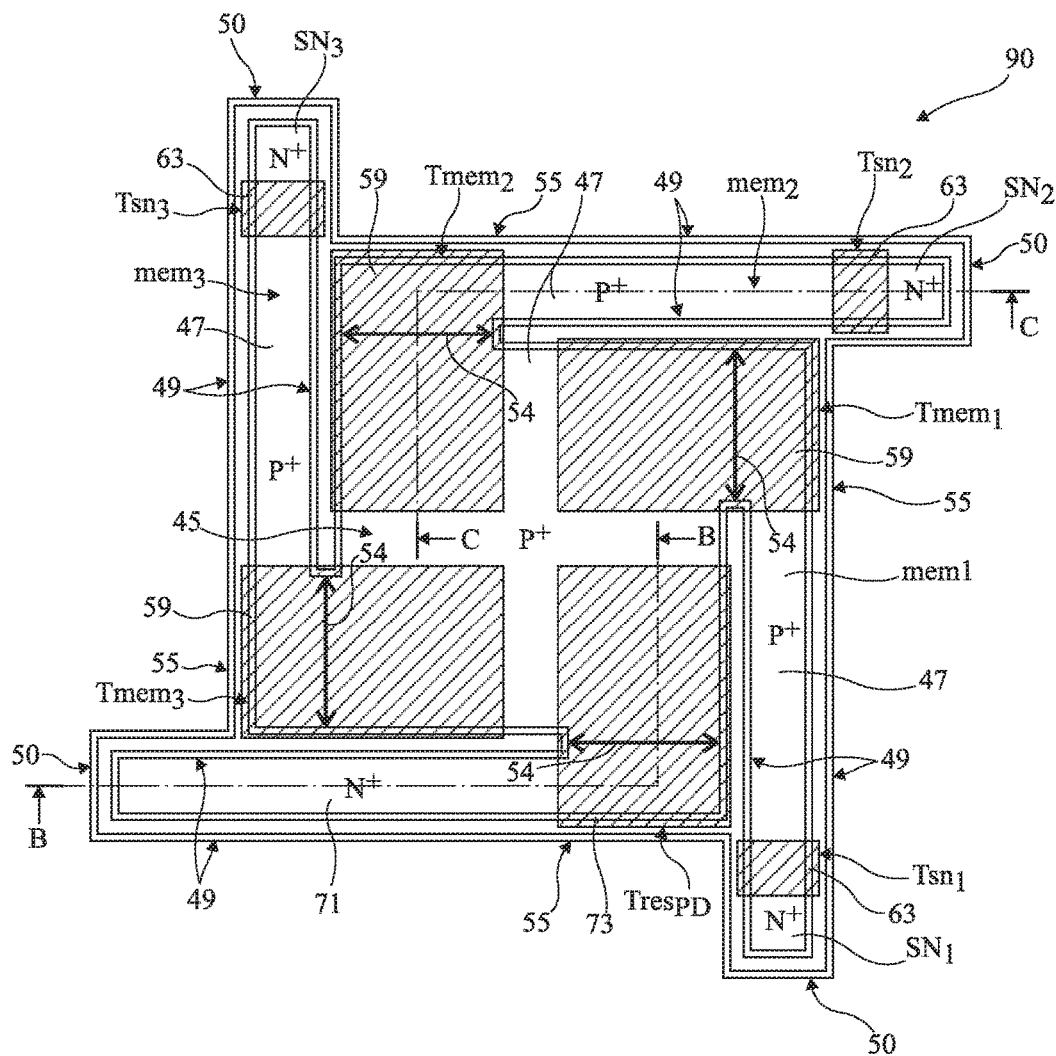
FIG. 7 schematically shows another alternative embodiment of the pixel of FIGS. 4A to 4D.

FIG. 7 is a simplified top view of another variation of pixel 40 of FIGS. 4A to 4C.

Pixel 90 of FIG. 7 comprises same elements as pixel 80 of FIG. 6, arranged relative one another in the same way as in pixel 80, with the difference that, in pixel 90, the $N^+$ drain 71 of transistor $Tres_{PD}$ and the assemblies of two associated areas $mem_i$ and $SN_i$ are longer. Thus, $N^+$ area 71 and assemblies $mem_i$, $SN_i$, each have one end arranged beyond the large side, opposite to photosensitive area PD, of a neighboring assembly $mem_i$, $SN_i$ or of $N^+$ area 71. Thus, as shown in FIG. 7, it is possible for gates $Tsn_i$ not to be adjacent to the gates of transistors $Tres_{PD}$ or $Tmem_i$, which eases the forming of the gates of transistors $Tsn_i$, $Tres_{PD}$, and $Tmem_i$.

TOF pixels 40, 80, and 90 where the gates of transistors $Tmem_i$ and $Tres_{PD}$ are arranged on the photosensitive area of these pixels have been described. These gates contribute to attracting the charges photogenerated in photosensitive area PD towards the surface of these pixels during a charge transfer from photosensitive area PD. In practice, such a charge transfer should be performed within a very short time, for example, shorter than 30 ns, whereby the charges photogenerated in photosensitive area PD should be attracted under the corresponding gate of a transistor $Tmem_i$ or $Tres_{PD}$ within a still shorter time. It is thus desirable for the photosensitive area to have a small surface area, for example, smaller than 5 µm*5 µm, or even smaller than 3 µm*3 µm, to limit the path of charges in photosensitive area PD.

Advantageously, due to the fact that in a TOF pixel 40, 80, or 90, photosensitive area PD may have a small surface area, and due to the fact that the storage areas may have small dimensions, for example, an approximate 0.2-µm width and an approximate 1-µm length, such a pixel may occupy a smaller surface area than that occupied by a SPAD-type TOF pixel. For example, TOF pixel 80 of FIG. 6 may occupy a surface area in the order of 3 µm*3 µm.

Specific embodiments have been described. Various alterations, modifications, and improvements will occur to those skilled in the art. In particular, a first heavily-doped P-type layer (P$^+$) may cover storage areas $mem_i$ while a second heavily-doped P-type layer (P$^+$) having a doping level and/or a thickness different from those of the first layer may cover $N_2$ charge collection area 45.

Similarly to what has been described for $N_1$ portions 41A, $N_1$ portion 41C of transistor $Tres_{PD}$ may comprise an $N_3$ area 69 adjacent to $N^+$ area 71 to improve the charge transfer controlled by transistor $Tres_{PD}$.

Each $N_1$ area 41B may comprise an area adjacent to the corresponding $N^+$ area $SN_i$, N-type doped with a doping level greater than $N_1$ and smaller than $N^+$, to avoid for charges to flow back from sense area $SN_i$ to storage area $mem_i$.

$N^+$ areas $SN_i$ and/or 71 may be formed in an N-type doped layer with a doping level different from that of layer $N_1$, for example, in a layer of doping level $N_3$. $N^+$ areas $SN_i$ and/or 71 may also be directly formed in substrate 43.

Substrate 43 may be N-type doped, with a doping level smaller than $N_1$, and it may then have a doping level which increases as the distance to $N_1$ layer 41 decreases.

The order and the number of steps of the previously-described manufacturing method may be modified. For example, in the case of a pixel which does not comprise areas 67 and/or 69, the implantation steps corresponding to the forming of these areas will be suppressed. In particular, in the case of a pixel which does not comprise $N_4$ area 67, it is provided for $N_5$ well 57 to occupy the entire storage area $mem_i$ and to have a small side aligned with a gate 59. Further, although a method of manufacturing a pixel where $N_5$ wells 57 will be formed after the transistor gates has been described, these wells may be formed before the gates, or even before $N_1$ layer 41.

In the case where a plurality of TOF pixels 40, 80, or 90 are formed next to one another, for example, in an array of pixels of an image sensor, two adjacent pixels may share elements such as portions of electrodes 49 and/or of their extensions 50, 55, sense areas $SN_i$, drain area 71 of transistor $Tres_{PD}$, and/or transistors of a read circuit coupled to sense areas $SN_i$.

Transistor $Tres_{PD}$ may be omitted in the previously-described pixels. Indeed, the charges photogenerated in photosensitive area PD being all transferred to sense areas $SN_i$, the photodiode resetting step may be suppressed.

The number of sets $S_i$ and of associated areas $SN_i$ may be selected to be greater than 3, possibly by providing for the photosensitive area to have the shape of a polygon, for example, a regular polygon, other than a square. For example, in a pixel comprising 6 sets $S_i$ and comprising no reset transistor $Tres_{PD}$, the photosensitive area for example has a substantially hexagonal shape.

More generally, the shape, the number, and the layout of the various elements forming previously-described pixels 40, 80, and 90 may be modified. For example, it may be provided for storage areas $mem_i$, the gates of transistors $Tmem_i$, photosensitive area PD, and more particularly charge collection area 45 of photosensitive area PD to be arranged relative to one another as described in patent application FR no 15/63457 filed on Dec. 30, 2015, which is incorporated herein by reference.

Although conductivity types have been described for the various areas, layers, and wells of a pixel in the case where the accumulated, collected, transferred, stored, and read charges are electrons, these conductivity types may all be inverted so that the charges are holes. It will be within the abilities of those skilled in the art to adapt the control potentials applied to the various transistors of the pixel.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A time-of-flight detection pixel comprising a semiconductor substrate including:
    a photosensitive area comprising a first doped layer of a first conductivity type and a charge collection area of the first conductivity type more heavily doped than the first doped layer and extending through at least part of the first layer;
    at least two charge storage areas each comprising a well of the first conductivity type more heavily doped than the charge collection area and separated from said charge collection area at least by a first portion of the first layer, the first portion being covered by a first gate, each charge storage area being laterally delimited by two insulated conductive electrodes, parallel to and facing each other; and
    a second doped layer of a second conductivity type covering the charge collection area and the at least two charge storage areas.

2. The pixel of claim 1, wherein each first portion of the first layer comprises a first intermediate area adjacent to the corresponding charge storage area, the first intermediate area being of the first conductivity type, more heavily doped than said first portion and less heavily doped than the well of said charge storage area.

3. The pixel of claim 1, wherein each charge storage area comprises a second intermediate area, interposed between the well of the charge storage area and the photosensitive area, the second intermediate area being of the first conductivity type, more heavily doped than the first portion and less heavily doped than the well.

4. The pixel of claim 1, wherein the photosensitive area is square-shaped in top view and has a plurality of edges, and each charge storage area extends along a different edge of the photosensitive area.

5. The pixel of claim 1, wherein the photosensitive area is substantially square-shaped in top view and has a plurality of edges, and each charge storage area extends from a different edge of the photosensitive area, orthogonally to said edge.

6. The pixel of claim 1, wherein the first layer is positioned on a portion of the semiconductor substrate of the second conductivity type and wherein the semiconductor substrate has a doping level which decreases as the distance to the first layer decreases.

7. The pixel of claim 1, further comprising a reset area of the first conductivity type more heavily-doped than the charge collection area, and separated from the charge collection area by a second portion of the first layer covered by a second gate arranged on the photosensitive area.

8. The pixel of claim 1, wherein the first gates are arranged on the photosensitive area and the charge collection area comprises a central portion arranged substantially at a center of the photosensitive area, and arms extending from said central portion between the gates arranged on the photosensitive area.

9. The pixel of claim 1, further comprising, for each charge storage area, a sense area of the first conductivity type more heavily doped than the well, separated from the well by a third portion of the first layer covered by a third gate, the third portion being arranged beyond the photosensitive area.

10. The pixel of claim 8, wherein the gates arranged on the photosensitive area are made of materials transparent to wavelengths of a received periodic signal.

11. The pixel of claim 1, further comprising a screen opaque to light which covers the pixel except for the photosensitive area.

12. The pixel of claim 1, wherein each first gate is configured to receive a signal configured to allow or forbid a charge transfer from the photosensitive area to the corresponding storage area.

13. The pixel of claim 1, wherein the semiconductor substrate is a semiconductor layer of semiconductor-on-insulator type.

14. An image sensor comprising:
    a pixel array including a plurality of time-of-flight detection pixels, wherein each pixel comprises:
        a photosensitive area comprising a first doped layer of a first conductivity type and a charge collection area of the first conductivity type more heavily doped than the first doped layer and extending through at least part of the first layer;

at least two charge storage areas each comprising a well of the first conductivity type more heavily doped than the charge collection area and separated from said charge collection area at least by a first portion of the first layer, the first portion being covered by a first gate, each charge storage area being laterally delimited by two insulated conductive electrodes, parallel to and facing each other, and a second doped layer of a second conductivity type covering the charge collection area and the at least two charge storage areas, a source emitting a periodic light signal, and a circuit configured for synchronizing operation of said source and application of control potentials to the gates of transistors of each pixel.

15. The image sensor of claim 14, wherein each first portion of the first layer comprises a first intermediate area adjacent to the corresponding charge storage area, the first intermediate area being of the first conductivity type, more heavily doped than said first portion and less heavily doped than the well of said charge storage area.

16. The image sensor of claim 14, wherein each charge storage area comprises a second intermediate area, interposed between the well of the charge storage area and the photosensitive area, the second intermediate area being of the first conductivity type, more heavily doped than the first portion and less heavily doped than the well.

17. The image sensor of claim 14, wherein the photosensitive area is square-shaped in top view and has a plurality of edges, and each charge storage area extends along a different edge of the photosensitive area.

18. The image sensor of claim 14, wherein the photosensitive area is substantially square-shaped in top view and has a plurality of edges, and each charge storage area extends from a different edge of the photosensitive area, orthogonally to said edge.

19. The image sensor of claim 14, wherein the first layer is positioned on a portion of a semiconductor substrate of the second conductivity type and wherein the semiconductor substrate has a doping level which decreases as the distance to the first layer decreases.

20. The image sensor of claim 19, wherein the semiconductor substrate is a semiconductor layer of semiconductor-on-insulator type.

21. The image sensor of claim 14, further comprising a reset area of the first conductivity type more heavily-doped than the charge collection area, and separated from the charge collection area by a second portion of the first layer covered by a second gate arranged on the photosensitive area.

22. The image sensor of claim 14, wherein the first gates are arranged on the photosensitive area and the charge collection area comprises a central portion arranged substantially at a center of the photosensitive area, and arms extending from said central portion between the gates arranged on the photosensitive area.

23. The image sensor of claim 22, wherein the gates arranged on the photosensitive area are made of materials transparent to wavelengths of a received periodic signal.

24. The image sensor of claim 14, further comprising, for each charge storage area, a sense area of the first conductivity type more heavily doped than the well, separated from the well by a third portion of the first layer covered by a third gate, the third portion being arranged beyond the photosensitive area.

25. The image sensor of claim 14, further comprising a screen opaque to light which covers the pixel except for the photosensitive area.

26. The image sensor of claim 14, wherein each first gate is configured to receive a signal configured to allow or forbid a charge transfer from the photosensitive area to the corresponding storage area.

27. A method of manufacturing a time-of-flight detection pixel comprising the successive steps of:

forming pairs of insulated vertical electrodes parallel to and facing each other, each electrode pair laterally delimiting a storage area extending longitudinally from a photosensitive area;

forming by implantation, in the photosensitive area, a first doped layer of a first conductivity type;

on the photosensitive area, forming first gates on first portions of the first layer having the storage areas extending therefrom;

in the photosensitive area, between the first gates, forming by implantation a charge collection area of the first type more heavily-doped than the first layer, the collection area having edges aligned with the first gates;

in each storage area, forming by implantation a well of the first type more heavily-doped than the charge collection area; and on the storage areas and on the charge collection area, forming by implantation a second doped layer of the second type.

* * * * *